(12) United States Patent
Selking

(10) Patent No.: US 9,043,662 B2
(45) Date of Patent: May 26, 2015

(54) DOUBLE DATA RATE MEMORY PHYSICAL INTERFACE HIGH SPEED TESTING USING SELF CHECKING LOOPBACK

(75) Inventor: John W. Selking, Round Rock, TX (US)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 341 days.

(21) Appl. No.: 12/413,928

(22) Filed: Mar. 30, 2009

(65) Prior Publication Data

US 2010/0251042 A1   Sep. 30, 2010

(51) Int. Cl.
  *G11C 29/02* (2006.01)
  *G01R 31/317* (2006.01)
  *G01R 31/319* (2006.01)
  *G11C 29/04* (2006.01)
  *G11C 11/401* (2006.01)

(52) U.S. Cl.
  CPC .......... *G11C 29/02* (2013.01); *G01R 31/31716* (2013.01); *G01R 31/317* (2013.01); *G01R 31/319* (2013.01); *G11C 2029/0405* (2013.01); *G11C 11/401* (2013.01); *G11C 29/022* (2013.01)

(58) Field of Classification Search
  CPC ...................... G11C 2029/5602; G11C 29/022; G11C 29/56004; G11C 2029/3602; G11C 2029/0405; G01R 31/31716; G01R 31/31905
  USPC .................................. 714/718, 719, 724, 733
  See application file for complete search history.

(56) References Cited

U.S. PATENT DOCUMENTS

| | | | |
|---|---|---|---|
| 6,898,741 B2 * | 5/2005 | Muljono et al. | 714/700 |
| 7,143,312 B1 * | 11/2006 | Wang et al. | 714/30 |
| 7,280,302 B1 * | 10/2007 | Masiewicz | 360/69 |
| 7,363,551 B2 * | 4/2008 | Muljono | 714/700 |
| 7,404,115 B2 * | 7/2008 | Boudon et al. | 714/715 |
| 7,519,891 B2 * | 4/2009 | Zimmerman | 714/738 |
| 7,565,582 B2 * | 7/2009 | Masuda et al. | 714/700 |
| 7,640,468 B2 * | 12/2009 | Linam et al. | 714/724 |
| 7,730,367 B2 * | 6/2010 | Parthasarathy | 714/716 |
| 7,793,175 B1 * | 9/2010 | Swarnkar et al. | 714/718 |
| 8,522,090 B1 * | 8/2013 | Swarnkar et al. | 714/718 |

* cited by examiner

*Primary Examiner* — James C Kerveros
(74) *Attorney, Agent, or Firm* — Sawyer Law Group, P.C.

(57) ABSTRACT

A double data rate memory physical interface having self checking loopback logic on-chip is disclosed. Disposed on the chip is a first linear feedback shift register, which is capable of generating a set of test data values that comprise at least two data bits. Also disposed on the chip is a second linear feedback shift register. The second linear feedback shift register is capable of generating a set of expected data values that match the test data values. Further, an internal loopback error check element is disposed on the chip. The internal loopback error check element is used to compare the set of expected data values with the set of test data values.

12 Claims, 4 Drawing Sheets

DOUBLE DATA RATE MEMORY PHYSICAL INTERFACE HIGH SPEED TESTING USING SELF CHECKING LOOPBACK

BACKGROUND OF THE INVENTION

1. Field of the Invention

This invention relates generally to systems and methods for testing memory, and more particularly to systems and methods for on-chip diagnostics using a high speed self checking loopback.

2. Description of the Related Art

Double data rate (DDR) synchronous dynamic random access memory (SDRAM) is a class of memory capable of providing approximately twice the bandwidth of single data rate SDRAM. DDR SDRAM achieves this increased bandwidth without requiring and increased clock frequency by transferring data on both the rising and falling edges of the clock signal. Because the increased bandwidth, DDR SDRAM often is used in the design of integrated circuits.

However, the high cost of manufacturing integrated circuits makes screening of finished goods from defects highly desirable. One aspect of screening is the testing of input and output interfaces on various aspects of the integrated circuit. For example, prior art techniques have been developed to test I/O interfaces for DDR memory, as illustrated next with reference to FIG. 1.

FIG. 1 is a block diagram showing a prior art daisy chain test system 100. The prior art daisy chain test system 100 generally is utilized to test the DDR interface, illustrated in FIG. 1 via the data pad 104 on the DDR memory device 102. Specifically, the prior art daisy chain test system 100 includes an external off-chip data generator 106 in communication with the data pad 104. In addition, an external off-chip comparator 110 is placed in communication with the data pad 104, and an external loopback element 108 is coupled to the output and input interfaces of the data pad 104. Generally, the external loopback element 108 comprises a simple wire that connects the output of the data pad 104 with the input of the data pad 104.

In operation, the external data generator 106 provides a bit lane of test data to the data pad 104 using a specialized test data input interface 112 of the DDR memory device 102. The specialized test data input interface 112 provides a mechanism for the test data to be provided to the DDR memory device 102 for testing purposes. Once the test data is provided to the data pad 104, the data is sent through an output data path of the data pad 104 to the external loopback element 108, which routs the test data back to the data pad 104 using an input data path of the data pad 104. Thereafter, the test is provided to the external off-chip comparator 110 via a specialized test data output interface 114 of the DDR memory device 102. The specialized test data output interface 114 provides a mechanism for the test data to be extracted from the DDR memory device 102 for testing purposes.

Thus, to test the DDR interface, the prior art daisy chain system 100 generally needs to provide test data to the DDR interface from an off-chip source, which is accomplished using the external data generator 106. Since it is desirable to test the functionality of the DDR memory device 102 interface, the test data is provided to the DDR memory device 102 prior to the output data path. Hence, as described above, a specialized test data input interface 112 generally is manufactured into the DDR memory device 102 for this purpose. Once the test data is sent through the output path and the data pad 104, the test data is looped back to the data pad 104 via the external loopback element 108. The returned test data is compared with expected values using an off-chip testing device, such as the external off-chip comparator 110 illustrated in FIG. 1. To fully test the input path, the external off-chip comparator 110 should acquire the returned test data after the input path. Hence, similar to above, a specialized test data output interface 114 generally is manufactured into the DDR memory device 102 for this purpose.

Unfortunately, since the test data is generated off-chip, timing issues can arise because of capability differences between the external off-chip data generator 106 and the DDR memory device 102. Similar issues can arise because of capability differences between the external off-chip comparator 110 and the DDR memory device 102. Moreover, the external loopback element 108 returns a single bit line of data back to the data pad. Thus, in order to fully test the device, the test generally is repeatedly run using a different data pin each time.

In view of the foregoing, there is a need for systems and methods for improved testing of DDR physical interfaces. The systems and methods should provide a mechanism to test the DDR physical interface while avoiding timing issues present when using off-chip testing equipment. The systems and methods should provide a mechanism to analyze production run modes with higher accuracy and ease.

SUMMARY OF THE INVENTION

The present invention addresses these needs by providing on-chip diagnostics using a high speed self checking loopback. Broadly speaking, embodiments of the present invention utilize on-chip test data generation and on-chip data comparison to provide self diagnostics that test multiple data bits, such as a byte lane, simultaneously. For example, in one embodiment a method for providing high speed testing is disclosed. The method includes internally generating a set of test data values on a chip, where the test data values comprise at least two bits of data. In addition, expected data values are internally generated on the chip that correspond to the test data values. The test data values are provided to an output data path of the chip, and then looped back to an input data path of the chip. Then, the test values received from the input data path are internally compared with the expected data values. In one embodiment, the test data values and the expected data values can each comprise a byte of data, and be generated using a first and second linear feedback shift registers that utilize identical linear functions to determine the state of the input bit. To create matching values for the test data values and the expected data values, the first and second linear feedback shift registers can be provided with identical initial seed values.

A memory interface having self checking loopback logic is disclosed in a further embodiment of the present invention. The memory interface includes an internal data generator disposed on the chip, which is capable of generating a set of test data values comprising at least two data bits. In addition, an internal loopback error check element is disposed on the chip. The internal loopback error check element is designed to generate a set of expected data values that correspond to the test data values. Hence, during testing, the internal error check element compares the expected data values with the test data values to test the double data rate physical memory interface. An output data path is generally in communication with the internal data generator, and an input data path is generally in communication with the internal loopback error check element and other system elements. In one embodiment, the input path is connected to the output data path via a bypass connection. During testing, the input data path can receive test data values from the output data path and provide them to the internal loopback error check element. In one embodiment, the interface can be set between testing and normal operating mode using a plurality of selection elements. For example, a first selection element can be included that is capable of selecting as input between the internal data generator and a normal data output. Once selected, the first selection element can provide the selected input to an output of the first selection element. In addition, a second selection element can be included that can select as input between the output of the first selection element and a normal data input, and provide the selected input to an output of the second selection element. During the testing mode of operation, the first selection element can be set to select the internal data generator as input and the second selection element can be set to select the output of the first selection element as input. In this aspect, a read capture element can be in communication with the output of the second selection element and the loopback error check element, thus providing the set of test data values to the loopback error check element during the testing mode of operation.

In an additional embodiment, a further memory interface having self-checking loopback logic is disclosed. In this embodiment, a first linear feedback shift register is included that is disposed on the chip. The first linear feedback shift register is capable of generating a set of test data values that comprise at least two data bits. In addition, a second linear feedback shift register is included that also is disposed on the chip. The second linear feedback shift register is capable of generating a set of expected data values that match the test data values. Also included is an internal loopback error check element that is disposed on the chip. The internal loopback error check element is used to compare the set of expected data values with the set of test data values. As discussed previously, the first and second linear feedback shift registers can be provided with identical initial seed values to ensure matching values are generated. To select between the testing mode and normal mode of operations, a first multiplexer can be included that selects between an output of the first linear feedback shift register and a normal data output, and a second multiplexer can be included that selects between an output of the first multiplexer and a normal data input. During the testing mode of operation, the first multiplexer can be set to select the output of the first linear feedback shift register and the second multiplexer can be set to select the output of the first multiplexer. Read capture flip-flops also can be included that are in communication with the output of the second multiplexer and the internal loopback error check element. In this aspect, the read capture flip-flops can provide the set of test data values to the loopback error check element during the testing mode of operation.

In this manner, embodiments of the present invention advantageously do not impact the timing relationship from testing mode to normal functional mode because the testing devices are provided on-chip and generally utilize the same data paths as signals during normal operation. In addition, the loopback connecting the output of first selection element and input of second selection element permits an extra value step for understanding how the DDR physical interface is functioning. That is, the loopback test allows a user to determine proper silicon skew budgets and various clock settings. Moreover, unlike prior art off-chip techniques, embodiments of the present invention allow testing of entire families of signals simultaneously. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for providing on-chip diagnostics using a high speed self checking loopback. Broadly speaking, embodiments of the present invention utilize on-chip test data generation and on-chip data comparison to provide self diagnostics. Moreover, as will be described in greater detail subsequently, embodiments of the present invention test multiple data bits, such as a byte lane, simultaneously. In this manner, embodiments of the present invention enable simultaneous testing of entire families of signals, allowing analysis of their relationship to one another. Embodiments of the present invention further provide an advantage of providing information to determine proper silicon skew budgets and various clock settings.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
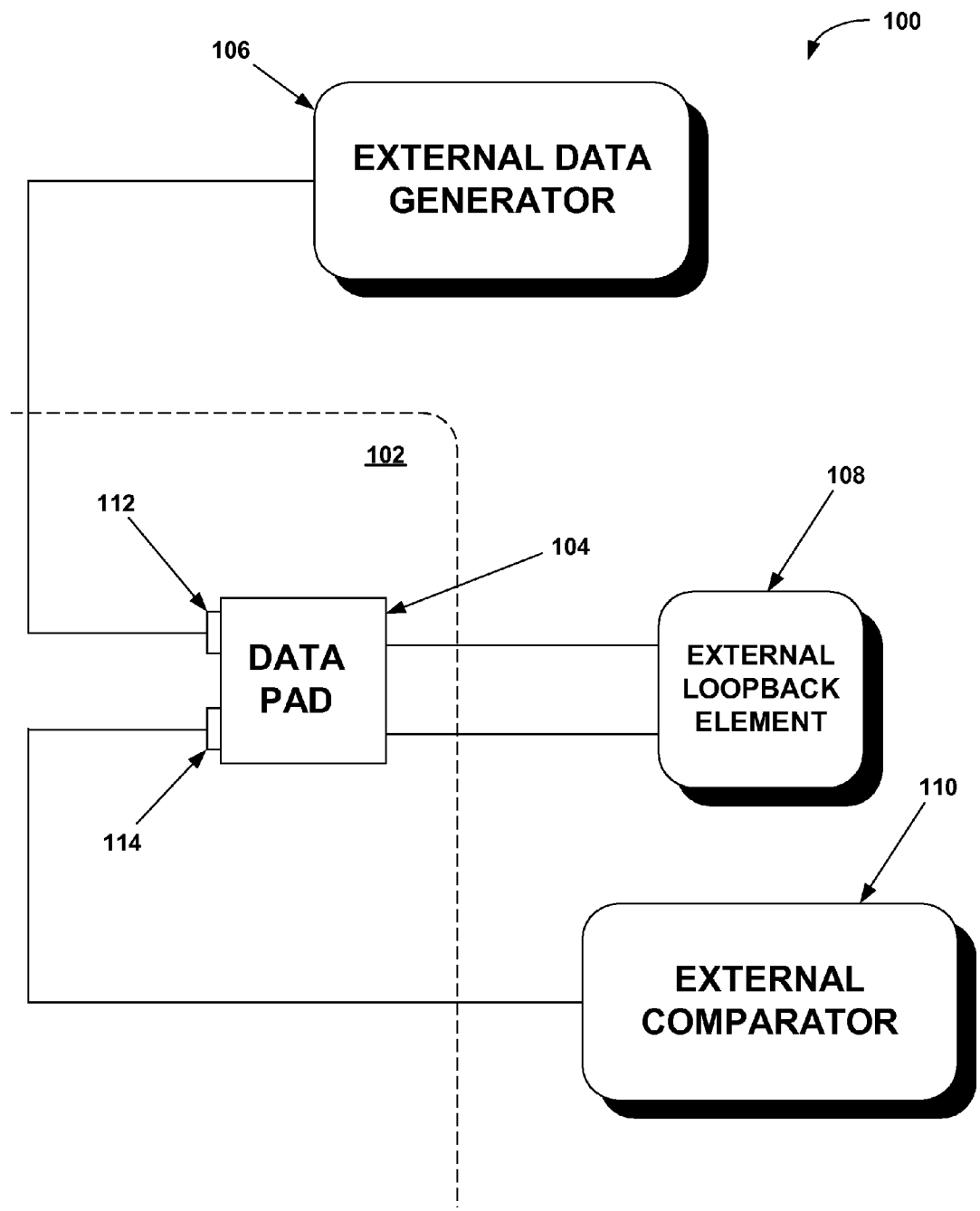
FIG. 1 is a block diagram showing a prior art daisy chain test system.
Figure 2:
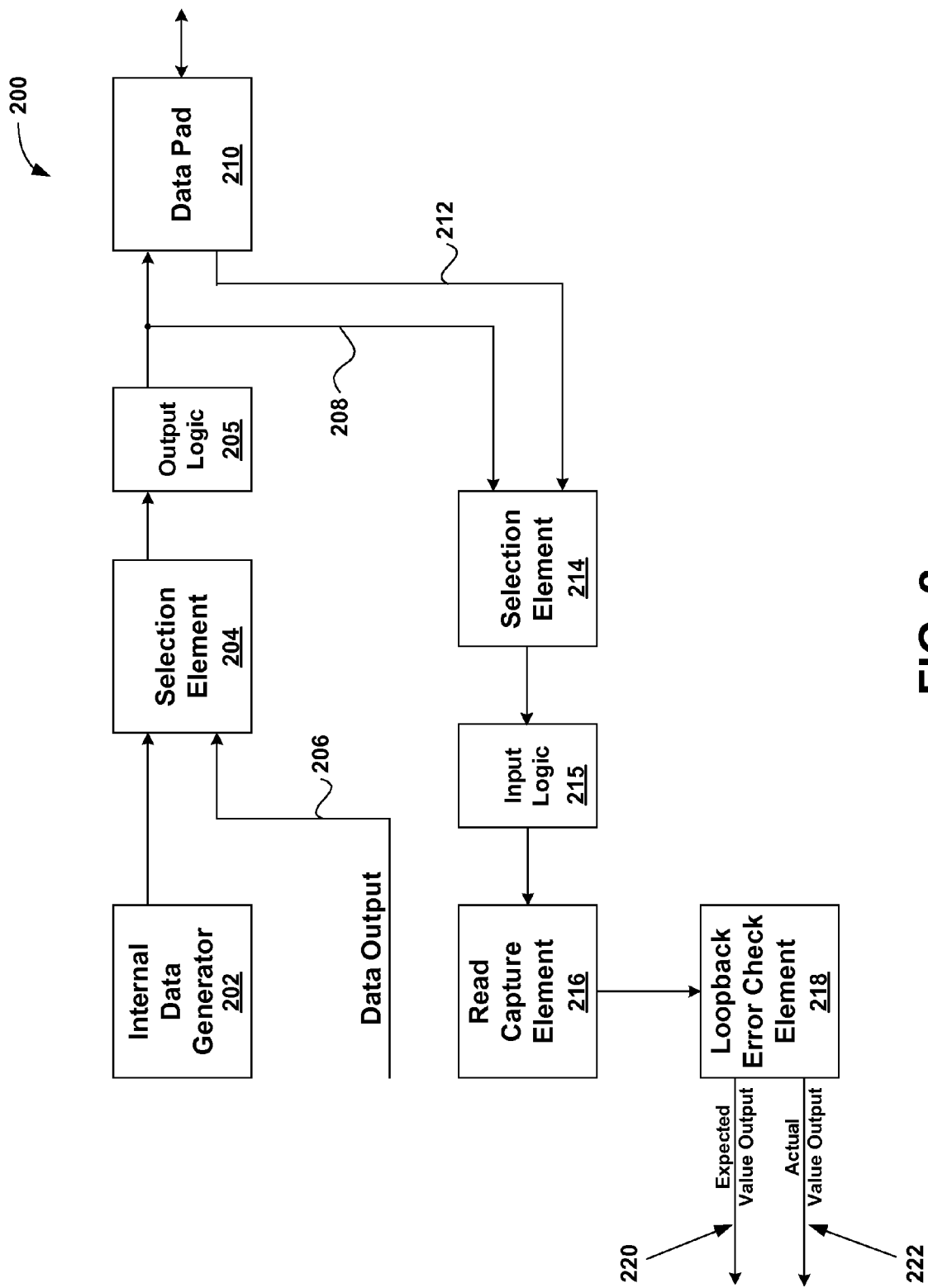
FIG. 2 is a block diagram showing exemplary self-check loopback test logic, in accordance with an embodiment of the present invention.

FIG. 1 was described in terms of the prior art. FIG. 2 is a block diagram showing exemplary self-check loopback test logic 200, in accordance with an embodiment of the present invention. The self-check loopback test logic 200 is located on-chip, thus avoiding requirements for off-chip data generation and comparison. As illustrated in FIG. 2, the self-check loopback test logic 200 includes an internal data generator 202 in electrical communication with a selection element 204, which is also in communication with a normal data output 206. The output of the selection element 204 is connected to output logic 205. The output logic 205 connects to data pad 210 and to an input of another selection element 214 via bypass connection 208. Selection element 214 is also in communication with a normal data input 212 from the data pad 210. The output of the selection element 214 is in communication with input logic 215 and a read capture element 216, which is further in communication with a loopback error check element 218 that provides an expected value output 220 and an actual value output 222. In one embodiment, the output logic 205, input logic 215, and read capture element 216 represent logic tested by embodiments of the present invention.

During normal operation, output data is provided along the normal data output 206 to the selection element 204. At this point, the selection element 204 is set to select as input the normal data output 206, which is provided on the output logic 205 and then to the data pad 210. The data pad 210 then provides the data to the rest of the system. When input data is received at the data pad 210, the input data is provided along the normal data input 212 to the selection element 214. The selection element 214 at this point is set to select as input the normal data input 212, which is provided to the output of the selection element 214 and then to the input logic 215 and the read capture element 216 for further processing and storage.

To perform a test of the input and output data paths, embodiments of the present invention set the self-check loopback test logic 200 to test mode by setting selection element 204 to select as input the output of the internal data generator 202 and setting selection element 214 to select as input the output 208 of selection element 204 via bypass connection 208. In addition, the internal data generator 202 generates test data, which is a family of signal data, such as a byte lane of test data. Embodiments of the present invention also generate expected data, which is a duplicate family of signal data matching the signal data generated by the internal data generator 202. During testing, the test data is provided to the selection element 204, which provides the test data to the output logic 205. The test data then passes through output logic 205, and on to selection element 214 via bypass connection 208. Selection element 214 then provides the test data to the input logic 215 and to the read capture element 216.

Next, the loopback error check element 218 receives the test data from the read capture element 216. Once the test data is received, the loopback error check element 218 compares the test data received from the read capture element 216 with the expected values for the test data. When the input and output data paths are functioning properly, the test data received from the read capture element 216 should match the expected values. If these values are different, the loopback error check element 218 can detect where the differences occur. In particular, the loopback error check element 218 provides the expected value on the expected value output 220 line and the actual values received from the read capture element 216 on the actual value output 222 line. Logic errors in output logic 205, input logic 215, and read capture element 216 are detected at this point.

In this manner, embodiments of the present invention advantageously do not impact the timing relationship from testing mode to normal functional mode because the testing devices are provided on-chip and generally utilize the same data paths as signals during normal operation. In addition, the loopback connecting the output 208 of selection element 204 and input of selection element 214 permits an extra value step for understanding how the DDR physical interface is functioning. That is, the loopback test allows a user to determine proper silicon skew budgets and various clock settings. Moreover, unlike prior art off-chip techniques, embodiments of the present invention allow testing of entire families of signals simultaneously, allowing analysis of there relationship to each other, as will be described in greater detail next with reference to FIG. 3.

Figure 3:
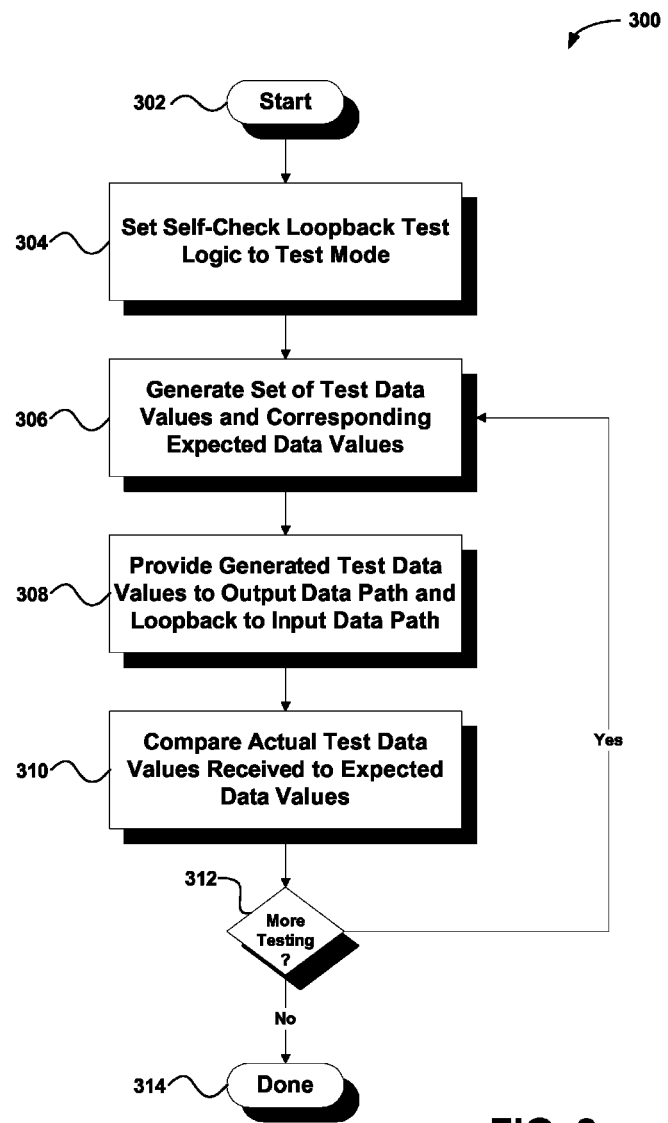
FIG. 3 is a flowchart showing a method for providing DDR memory physical interface high speed testing using a self checking loopback, in accordance with an embodiment of the present invention.

FIG. 3 is a flowchart showing a method 300 for providing DDR memory physical interface high speed testing using a self checking loopback, in accordance with an embodiment of the present invention. In an initial operation 302, preprocess operations are performed. Preprocess operations can include, for example, providing initial seed values to the internal data generator, providing initial seed values to the loopback error check element, and other preprocess operations that will be apparent to those skilled in the art after a careful reading of the present disclosure.

In operation 304, the self-check loopback test logic is set to test mode. As mentioned above, embodiments of the present invention allow two modes of operation: test mode and functional mode. In functional mode, the internal data generator is bypassed in order to allow normal data output to pass through the logic. However, when set to test mode, the internal data generator is allowed to pass test data through the test logic, as illustrated next with reference to FIG. 4.

Figure 4:
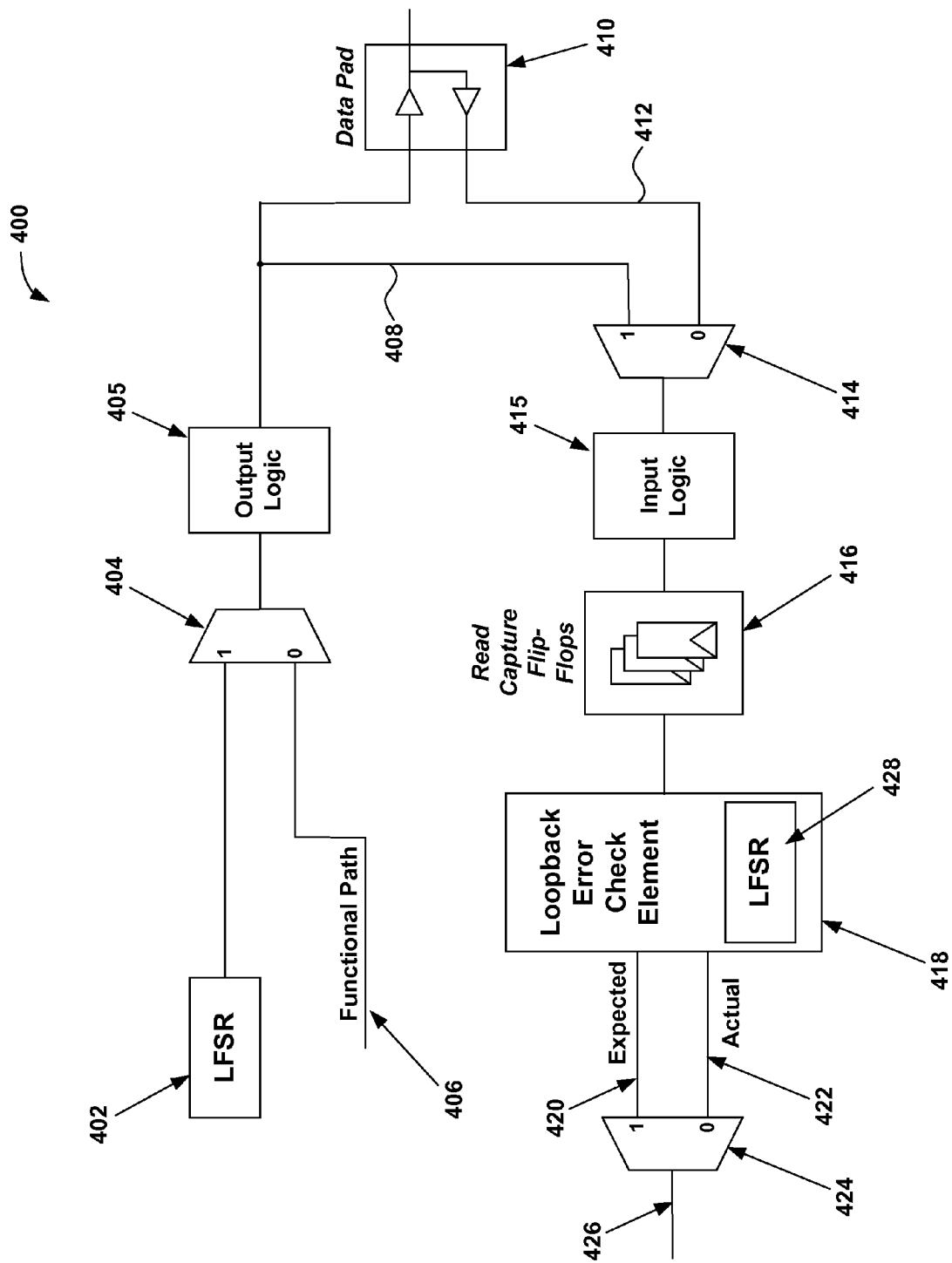
FIG. 4 is a schematic diagram of exemplary self-check loopback test logic, in accordance with an embodiment of the present invention.

FIG. 4 is a schematic diagram of exemplary self-check loopback test logic 400, in accordance with an embodiment of the present invention. The exemplary self-check loopback test logic 400 includes an internal data generator, which in the example of FIG. 4, is in the form of a linear feedback shift register 402. The linear feedback shift register 402 is a shift register that includes an input bit that is a linear function of its previous state. For example, the input bit of the linear feedback shift register 402 can be driven by an exclusive- or (XOR) of other bits of the overall shift register value. Once given a seed value, the linear feedback shift register 402 can produce values that approximate random values having a long cycle time before repeating. As a result, the linear feedback shift register 402 functions as a high-quality internal data generator.

The output of the linear feedback shift register 402 is provided to an input of a multiplexer 404, which functions as a selection element that selects between the output of the linear feedback shift register 402 and a functional path 406 used as a normal data output for the chip. The output of the multiplexer 404 is connected to output logic 405, which in turn connects to data pad 410 and to an input of another multiplexer 414, via bypass connection 408. The multiplexer 414 functions as a selection element that selects between the output of multiplexer 404 via bypass connection 408 and a normal data input 412 from the data pad 410. The output of the multiplexer 414 is in communication with input logic 415 and read capture flip-flops 416, which function as a read capture element and provide input data to a loopback error check element 418. The loopback error check element 418 provides an expected value output 420 and an actual value output 422 to multiplexer 424, which selects one of the signals to provide as test output 426, depending on the setting of multiplexer 424. In one embodiment, the output logic 405, input logic 415, and read capture flip-flops 416 represent logic tested by embodiments of the present invention.

During normal operation, output data is provided along the functional path 406 to the multiplexer 404. At this point, multiplexer 404 is set to select as input the functional path 406, which is provided to the output logic 405 and then to the data pad 410. The data pad 410 then provides the data to the rest of the system. When input data is received at the data pad 410, the input data is provided along the normal data input 412 to multiplexer 414. Multiplexer 414 at this point is set to select as input the normal data input 412, which is provided to the output of multiplexer 414 and then to the input logic 415 and the read capture flip-flops 416 for further processing and storage.

The self-check loopback test logic 400 is set to test mode, during operation 304 of FIG. 3, by setting multiplexer 404 to select as input the output of the linear feedback shift register 402 and setting multiplexer 414 to select as input the output 408 of multiplexer 404. In this manner, data generated by the linear feedback shift register 402 will be looped back to the read flip-flops 416.

Referring back to FIG. 3, a set of test data and a corresponding set of expected data values are generated in operation 306. Turning to FIG. 4, the linear feedback shift register 402 generates a set of test data based on an initial seed value provided to the linear feedback shift register 402 prior to testing. The values generated by the linear feedback shift register 402 are deterministic. Hence, when given the same seed value, the linear feedback shift register 402 will generate the same values. Embodiments of the present invention utilized this principle to generate a set of expected data values for the loopback error check element 418. Specifically, in the embodiment of FIG. 4, the loopback error check element 418 includes a linear feedback shift register 428 that functions in a substantially similar manner to the linear feedback shift register 402. The test data values generated by the linear feedback shift register 428 correspond to the test data values generated by linear feedback shift register 402 because the linear feedback shift register 428 is given the same seed value as the seed value provided to linear feedback shift register 402. That is, because of the deterministic nature of a linear feedback shift register, the linear feedback shift register 428 generates the same data values as generated by linear feedback shift register 402 when provided with the same seed value. Thus, the data values generated by linear feedback shift register 428 are utilized as the expected data values, which will match the test data values generated by linear feedback shift register 402.

Referring back to FIG. 3, the generated test data is provided to the output data path and looped back to the input data path in operation 308. Turning to FIG. 4, the set of test data values is provided to multiplexer 404, which selects the test data values as input and provides the set of test data values to the output logic 405. In addition, multiplexer 414 selects the output of the output logic 405 via bypass connection 408 as input and provides the set of test data values to the input logic and the read capture flip-flops 416.

Next, in operation 310 of FIG. 3, the actual test data received from the input data path is compared to the expected data values generated in operation 306. Referring back to FIG. 4, once the test data values are provided to the read capture flip-flops 416, the read capture flip-flops 416 provide the test data to the loopback error check element 418. The loopback error check element 418 then compares the test data received from the read capture flip-flops 416 with the set of expected data values generated by linear feedback shift register 428. When the input and output data paths, logic blocks 405, 415, and 416, are functioning properly, the test data received from the read capture flip-flops 416 should match the expected data values generated by linear feedback shift register 428. If these values are different, the loopback error check element 418 can detect where the differences occur. In particular, the loopback error check element 418 provides the expected values on the expected value output line 420 and the actual values received from the read capture flip-flops 416 on the actual value output line 422. Thereafter, multiplexer 424 can select which input to place of the test output line 426.

Turning back to FIG. 3, a decision is made as to whether more testing is to be performed in operation 312. If more testing is to be performed, the method 300 branches to another test data and expected value generation operation 306, in which new test data and corresponding expected values are generated. Otherwise, when no more testing is to be performed, the method 400 ends in operation 314.

Post process operations are performed in operation 314. Post process operations can include, for example, setting the self-check loopback test logic to normal operation mode by setting multiplexer 404 to select as input the functional path 406 and setting multiplexer 414 to select as input the normal input data path 412, and other post process operations that will be apparent to those skilled in the art after a careful reading of the present disclosure. In this manner, embodiments of the present invention advantageously do not impact the timing relationship from testing mode to normal functional mode because the testing devices are provided on-chip and generally utilize the same data paths as signals during normal operation.

In addition, as mentioned previously, the loopback connecting the output path selection element to the input path selection element permits an extra value step for understanding how the DDR physical interface is functioning. That is, the loopback test allows a user to determine proper silicon skew budgets and various clock settings. Moreover, unlike prior art off-chip techniques, embodiments of the present invention allow testing of entire families of signals simultaneously, allowing analysis of there relationship to each other.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for providing multi-mode high speed on-chip test data generation and on-chip data comparison to provide self-diagnostics testing of multiple data bits of a double data rate (DDR) physical interface, comprising the operations of:

selecting a first mode of the multi-mode to enable an on-chip bypass connection using a self-check loopback test logic, generating a set of on-chip test data values using a first linear feedback shift register (LSFR), wherein the set of test data values comprise at least two bits of data;

generating a set of on-chip expected data values, being a family of signal data, using a second LSFR, wherein the set of expected data values correspond to the set of test data values;

providing the set of test data values to an output data path of the chip;

looping back the set of test data values from the output data path of the chip to an input data path of the chip via the on-chip bypass connection;

receiving the set of test data values from the output data path and providing them to an on-chip loopback error check element via read capture flip-flops that provides an expected value output and an expected value output;

comparing the received set of test values with the set of expected data values;

determining a state of operation of the DDR physical interface by comparing the set of test data values and the set of expected data values, where if the set of test data values and the set of expected values match, the state is operational, and if the set of test data values and the set of expected values do not match, the state is in error and the check element determines where the differences between the set of test data values and the set of expected values occur by providing an expected value on an expected value output line and an actual value on an actual value line thereby determining one or more logic errors in one or more of output logic, input logic, and read capture element; and, providing an output in response to the state detected, wherein the method further provides for the testing of entire families of signals simultaneously.

2. The method of claim 1, wherein set of the test data values and the set of expected data values each comprise a byte of data.

3. The method of claim 1, wherein the first linear feedback shift register and the second linear feedback shift register are provided with corresponding initial seed values.

4. The method of claim 1, wherein the first linear feedback shift register and the second linear feedback shift register utilize identical linear functions to the set of test data values and wherein the comparing utilizes a loopback error check element.

5. The method of claim 1, wherein the chip is a double data rate memory.

6. A memory interface having self-checking loopback logic with a plurality of modes for on chip test data generation and on-chip data comparison to provide self-diagnostics testing of multiple data bits of a double data rate (DDR) physical interface, comprising:

an internal data generator disposed on a chip, the internal data generator capable of generating a set of test data values in response to selecting a first mode of the multi-mode to enable an on-chip bypass connection using a self-check loopback test logic, the set of test data values comprising at least two data bits and being a family of signal data;

a first selection element connected to the internal data generator and capable of selecting as input between the internal data generator and a normal data output, the first selection element being capable of providing the selected input to an output of the first selection element;

a second selection element connected to the first selection element and capable of selecting as input between the output of the first selection element and a normal data input, the second selection element being capable of providing the selected input to an output of the second selection element thereby providing the set of test data values to read capture flip-flops; and an internal on-chip loopback error check element, the error check element capable of generating a set of expected data values that correspond to the set of test data values and being a family of signal data, wherein the error check element compares the set of expected data values with the set of test data values received from the read capture flip-flops during testing, determines a state of operation of the DDR physical interface by comparing the set of test data values and the set of expected data values, where if the set of test data values and the set of expected values match the state is operational, and if the set of test data values and the set of expected values do not match the state is in error and the error check element determines where the differences between the set of test data values and the set of expected values occur by providing an expected value on an expected value output line and an actual value on an actual value line, thereby determining one or more logic errors in one or more of output logic, input logic, and read capture element;

and provides an output in response to the state detected, wherein the memory interface further provides for the testing of entire families of signals simultaneously.

7. The memory interface of claim 6, further comprising:

an output data path in communication with the internal data generator, the output data path capable of providing the set of test data values to other system elements; and an input data path in communication with the other system elements and the internal loopback error check element, the input data path capable of receiving values from the other system elements.

8. The memory interface of claim 6, wherein the internal data generator element is a first linear feedback shift register.

9. The memory interface of claim 8, wherein the internal loopback check element includes a second linear feedback shift register.

10. The memory interface of claim 9, wherein the first linear feedback shift register and the second linear feedback shift register are provided with corresponding initial seed values.

11. The memory interface of claim 6, wherein the first selection element is set to select the internal data generator as input and the second selection element is set to select the output of other system elements as input during a testing mode of operation.

12. The memory interface of claim 6, wherein the first selection element is a first multiplexer and the second selection element is a second multiplexer.

* * * * *